(12) United States Patent
Meyhoefer et al.

(10) Patent No.: US 7,376,925 B2
(45) Date of Patent: May 20, 2008

(54) METHOD FOR PRODUCTION OF A STANDARD CELL ARRANGEMENT, AND APPARATUS FOR CARRYING OUT THE METHOD

(75) Inventors: Gerd Meyhoefer, Schoenberg (DE); Sven Piatkowski, Munich (DE)

(73) Assignee: Infineon Technologies AG, Munich (DE)

( * ) Notice: Subject to any disclaimer, the term of this patent is extended or adjusted under 35 U.S.C. 154(b) by 480 days.

(21) Appl. No.: 11/193,024

(22) Filed: Jul. 29, 2005

(65) Prior Publication Data
US 2006/0059448 A1 Mar. 16, 2006

(30) Foreign Application Priority Data
Jul. 30, 2004 (DE) .................. 10 2004 038 063

(51) Int. Cl.
*G06F 17/50* (2006.01)
(52) U.S. Cl. .................. 716/10; 716/8; 716/9; 716/11; 716/12; 716/13; 716/14; 716/15; 716/16
(58) Field of Classification Search ............. 716/8–16
See application file for complete search history.

(56) References Cited

U.S. PATENT DOCUMENTS

| | | | | |
|---|---|---|---|---|
| 4,786,613 A | * | 11/1988 | Gould et al. ............... 438/129 |
| 4,811,237 A | * | 3/1989 | Putatunda et al. ........... 716/9 |
| 5,165,086 A | * | 11/1992 | Kamejima et al. ........... 716/8 |
| 5,313,079 A | * | 5/1994 | Brasen et al. ............... 257/206 |
| 5,410,173 A | * | 4/1995 | Kikushima et al. ......... 257/368 |
| 5,471,398 A | * | 11/1995 | Stephens .................... 716/21 |
| 5,535,134 A | | 7/1996 | Cohn et al. |
| 5,619,419 A | * | 4/1997 | D'Haeseleer et al. ......... 716/8 |
| 5,636,129 A | * | 6/1997 | Her ........................... 716/12 |
| 5,856,927 A | * | 1/1999 | Greidinger et al. ........... 716/12 |
| 5,887,155 A | * | 3/1999 | Laidig ........................ 716/10 |
| 6,002,857 A | * | 12/1999 | Ramachandran ............. 716/14 |
| 6,014,506 A | * | 1/2000 | Hossain et al. ............... 716/11 |
| 6,209,123 B1 | * | 3/2001 | Maziasz et al. .............. 716/14 |
| 6,249,902 B1 | * | 6/2001 | Igusa et al. .................. 716/10 |
| 6,260,177 B1 | * | 7/2001 | Lee et al. .................... 716/2 |
| 6,271,548 B1 | * | 8/2001 | Umemoto et al. ........... 257/202 |
| 6,292,929 B2 | * | 9/2001 | Scepanovic et al. ......... 716/14 |
| 6,735,742 B2 | * | 5/2004 | Hatsch et al. ............... 716/2 |

(Continued)

FOREIGN PATENT DOCUMENTS

EP 0 685 804 A2 12/1995

*Primary Examiner*—Jack Chiang
*Assistant Examiner*—Naum Levin
(74) *Attorney, Agent, or Firm*—Slater & Matsil, L.L.P.

(57) ABSTRACT

A standard cell arrangement can be produced by automatically determining a distance between at least two standard cells in at least one standard cell row. The method also automatically determines whether at least one of the determined distances is less than a predetermined minimum distance. If the distance is less than the minimum distance in at least one case, the width of at least one standard cell in the standard cell row in a virtual layout of standard cells is broadened in a predetermined manner. The broadened standard cell is automatically placed in the virtual layout with other standard cells. The placement of the broadened standard cell in the virtual layout is transferred to the real layout of the standard cells. In this manner, the standard cells are provided with the originally intended width again, in order to create greater distances between the standard cells in the real layout.

14 Claims, 4 Drawing Sheets

U.S. PATENT DOCUMENTS

| | | | |
|---|---|---|---|
| 7,028,285 B2 * | 4/2006 | Cote et al. | 716/21 |
| 7,137,092 B2 * | 11/2006 | Maeda | 716/8 |
| 2001/0004762 A1 | 6/2001 | Matsumoto et al. | |
| 2003/0023938 A1 * | 1/2003 | Nagasaka et al. | 716/2 |
| 2003/0101424 A1 | 5/2003 | Hayakawa | |
| 2005/0044522 A1 * | 2/2005 | Maeda | 716/18 |
| 2005/0156200 A1 * | 7/2005 | Kinoshita | 257/207 |
| 2006/0080630 A1 * | 4/2006 | Lin | 716/11 |

* cited by examiner

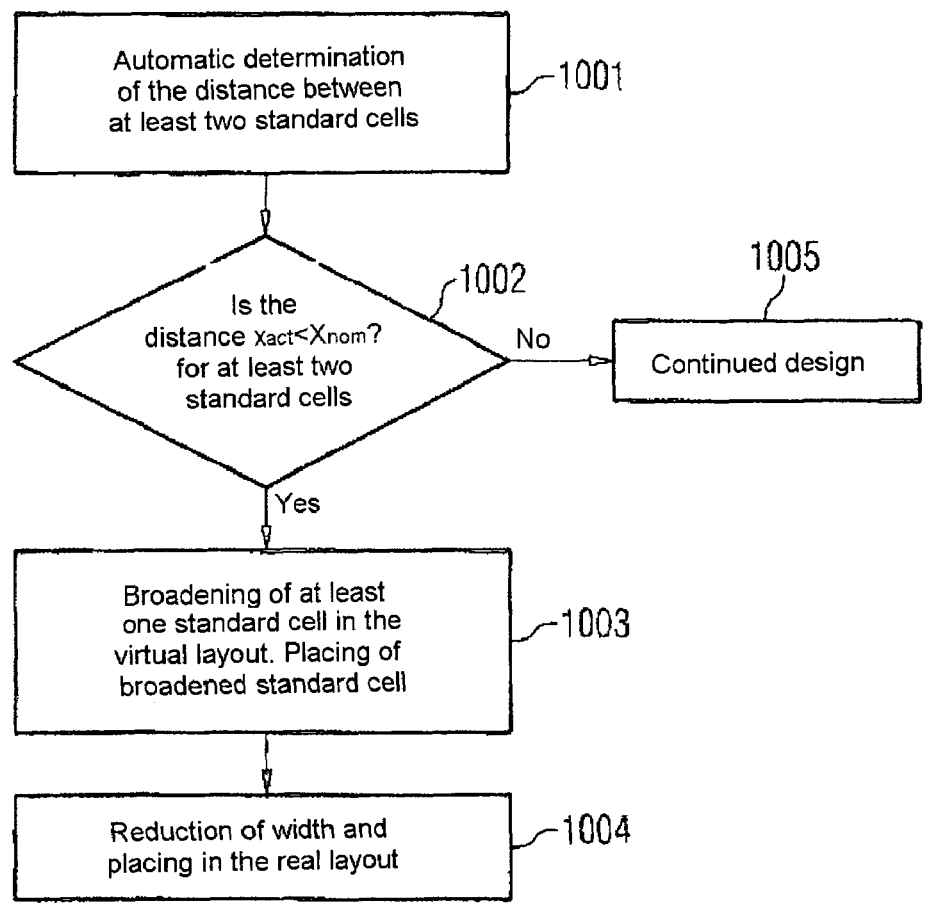
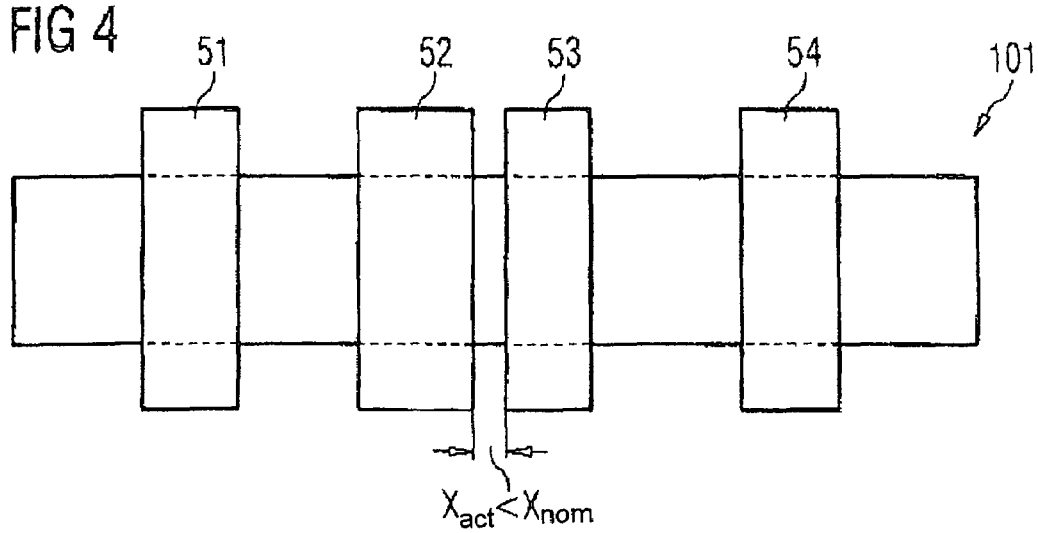

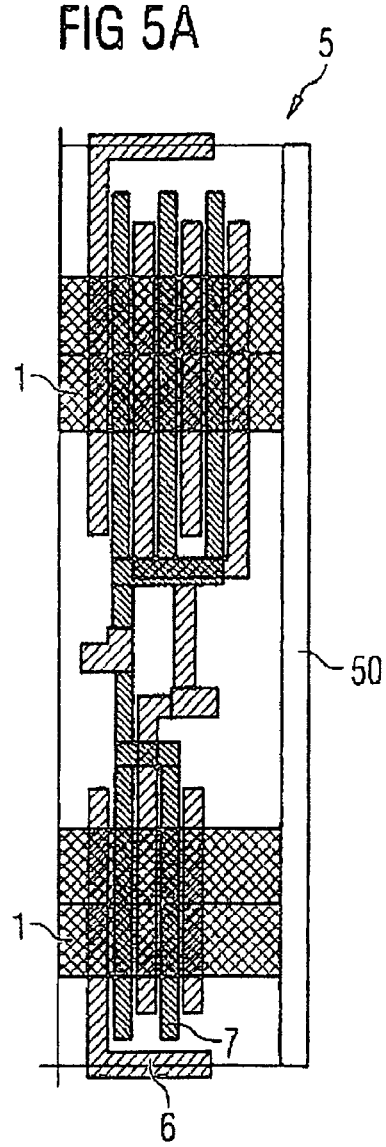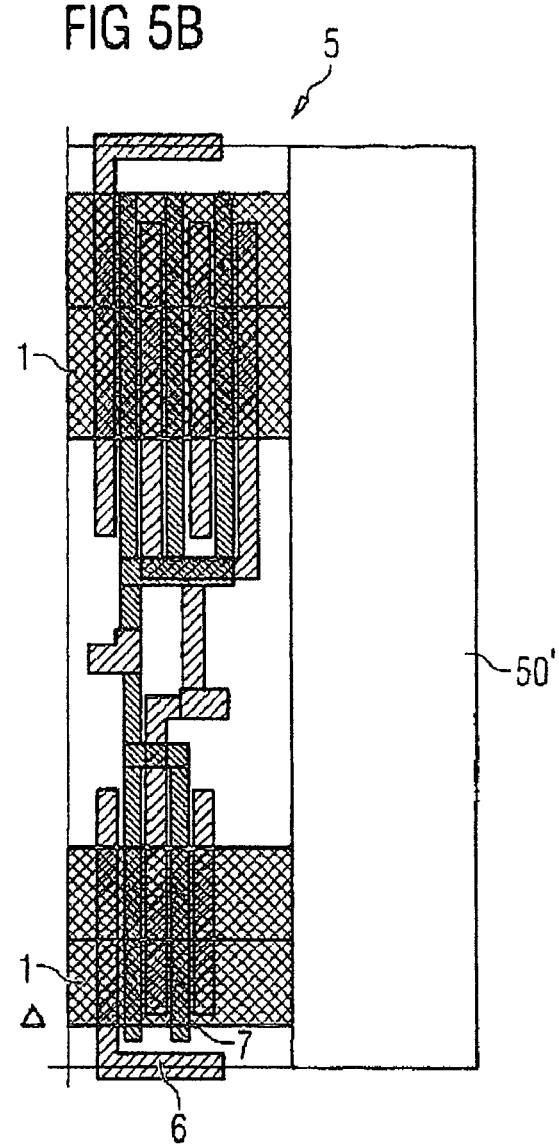
FIG 5A
FIG 5B

METHOD FOR PRODUCTION OF A STANDARD CELL ARRANGEMENT, AND APPARATUS FOR CARRYING OUT THE METHOD This application claims priority to German Patent Application 10 2004 038 063.5, which was filed Jul. 30, 2004 and is incorporated herein by reference.

TECHNICAL FIELD

The invention relates to a method for production of a standard cell arrangement, and to an apparatus for carrying out the method.

BACKGROUND

Standard cells are used in order to speed up the design of a semiconductor chip. By way of example, standard cells are gates, shift registers or other digital or analog modules, which are formed from individual integrated components, such as transistors, diodes or resistors, and which generally provide one or more standardized functions. In addition to standard cells, other elements are normally also arranged on the semiconductor chips.

The standard cells are normally arranged in a plurality of mutually adjacent rows. The standard cells in one row are supplied with electrical power by means of tracks arranged along the row. The associated power supply tracks in each row are connected to one another and to further elements or connections of the semiconductor chip.

Furthermore, normally, further tracks are provided, in particular for transmission of analog or digital signals between the standard cells and into connections of the semiconductor chip. The tracks are arranged in one, or generally more, so-called metallization layers.

In order to arrange the tracks optimally, a so-called router program is used, which connects the inputs and outputs of standard cells to one another and to connections of the semiconductor chip. The respective position and/or the profile of the individual tracks are/is then disentangled in order to allow the standard cells and/or the tracks to be arranged as densely as possible and in order to allow as short a signal delay as possible. In addition to this known arrangement of standard cells and their wiring, further arrangement regulations, of course, such as a vertical or functionally related arrangement are feasible, for example in order to separate a digital area and an analog area on an ASIC or the like.

Place and route methods, by means of which standard cells can be placed and wired up, are known from the production of ASIC semiconductor components (ASIC: Application Specific Integrated Circuit).

In typical ASICs there are a large number (in comparison to memory design (for example, DRAM)) of metal layers available for wiring, so that the standard cells in ASICs can be placed very densely; there are no problems in connecting the cells to one another.

The use of standard cells can be particularly problematic in the case of memory components, since fewer metal layers are available, and the standard cell density that can be achieved is therefore considerably less. This results in the need for wiring channels transversely with respect to the direction of standard cell rows.

SUMMARY OF THE INVENTION

In one aspect, the present invention provides a standard cell arrangement with good space utilization for wiring.

In a preferred embodiment, a standard cell arrangement can be produced by automatically determining a distance between at least two standard cells in at least one standard cell row. The method also automatically determines whether at least one of the determined distances is less than a predetermined minimum distance. If the distance is less than the minimum distance in at least one case, the width of at least one standard cell in the standard cell row in a virtual layout of standard cells is broadened in a predetermined manner. The broadened standard cell is automatically placed in the virtual layout with other standard cells. The placement of the broadened standard cell in the virtual layout is transferred to the real layout of the standard cells. In this manner, the standard cells are provided with the originally intended width again in order to create greater distances between the standard cells in the real layout.

This allows local loosening of the placing, which improves the capability for connection of the standard cells. There is no need to move the cells manually.

In this case, it is advantageous for broadening of at least one standard cell in the virtual layout to be carried out by an integer multiple of a predetermined grid width.

The apparatus according to one embodiment of the invention includes a means for automatic determination of the distance $x_{act}$ between at least two standard cells, a comparison means for automatically determining whether at least one of the distances $x_{act}$ is less than a predetermined minimum distance $x_{nom}$, a modification means for broadening the width of at least one standard cell in the standard cell row in a virtual layout of standard cells in a predetermined manner if the distance is less than the minimum distance $x_{nom}$, and the at least one broadened standard cell is automatically placed in the virtual layout with other standard cells; and a placing means for placing the broadened standard cells in the virtual layout into the real layout of the standard cells wherein the standard cells are provided with the originally intended width again in order to create greater distances between the standard cell in the real layouts.

These means may be in the form of software on a computer, or in the form of hardware components.

BRIEF DESCRIPTION OF THE DRAWINGS

The invention will be explained in more detail in the following text with reference to a number of exemplary embodiments in the figures of the drawings, in which:

FIG. 3 shows a program procedure for one embodiment of the method according to the invention;

FIG. 4 shows an illustration of the first method step on the basis of four standard cells; and FIGS. 5A-B show an illustration of a third method step on the basis of the broadening of one standard cell.

The following list of reference symbols can be used in conjunction with the figures:

1 Voltage supply track
2 Metal tracks
5, 51, 52, 53, 54 Standard cells
6, 7 Internal connecting lines 50 Standard cell edge
50' Standard cell with broadened standard cell edge in the virtual layout
101, 102, 103, 104 Standard cell row
201 202, 203 Vertical wiring channel
$x_{act}$ Distance determined between standard cells
$x_{nom}$ Nominal distance between standard cells

DETAILED DESCRIPTION OF ILLUSTRATIVE EMBODIMENTS

Figure 1:
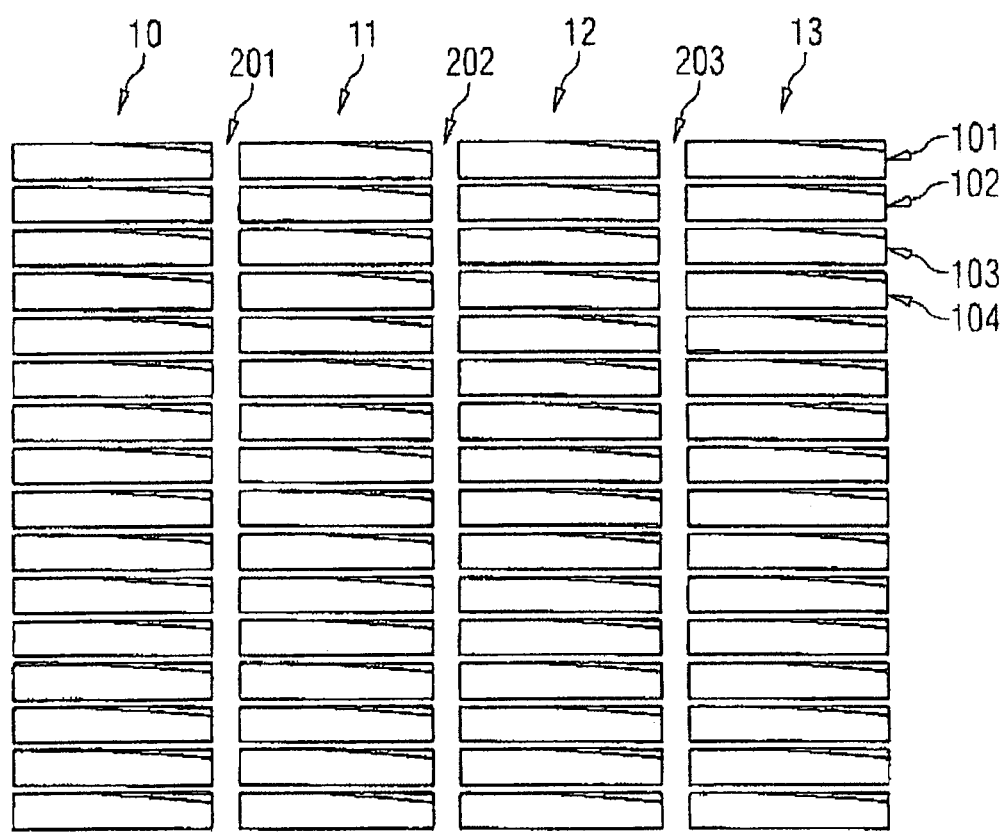
FIG. 1 shows an illustration of four groups of horizontal standard cell rows in 16 rows with wiring channels for a memory module.

In order to demonstrate the technical background, FIG. 1 shows standard cell rows 101, 102, 103, 104 with vertical wiring channels 201, 202, 203 located between them. The wiring channels 201, 202, 203 separate the standard cell rows 101, 102, 103, 104 into individual standard cell groups; in this case four standard cell groups 10, 11, 12, 13, each with 16 rows.

The standard cell rows 101, 102, 103, 104 are in this case, each composed of standard cells that are known per se but not illustrated here (for example logic gates, flipflops, latches).

The length of the standard cell rows 101, 102, 103, 104 and the width of the vertical wiring channels 201, 202, 203, which are located between them, are determined by two opposing factors.

On the one hand, the standard cell rows 101, 102, 103, 104, should be as long as possible in order to reduce the area required for the circuit. The longer the standard cell rows 101, 102, 103, 104 without any interruption and the narrower the vertical wiring channels 201, 202, 203 are, the less space is required.

On the other hand, the capability to wire up the circuit becomes ever more difficult the longer the standard cell rows 101, 102, 103, 104. If the rows are too long, it is no longer possible to connect pins which are generally located within a standard cell row 101, 102, 103, 104.

In order to make it possible to further optimize the area of standard cell rows 101, 102, 103, 104 (and thus of the circuit) it is desirable for the voltage supply tracks, which are not illustrated in FIG. 1, but which supply voltage and ground to all of the standard cells in one of the standard cell rows 101, 102, 103, 104 to be as narrow as possible.

This aim is contrary to two physical effects:
1. The narrower the voltage supply tracks are, the greater is the voltage drop across the voltage supply tracks and the poorer is the supply to the standard cells, which are arranged well away from the voltage connections; and
2. The narrower the voltage supply tracks are, the higher, in addition, is the risk of "electromigration" (a discontinuity on the line as a result of material migration when subjected to continuous load).

Figure 2A:
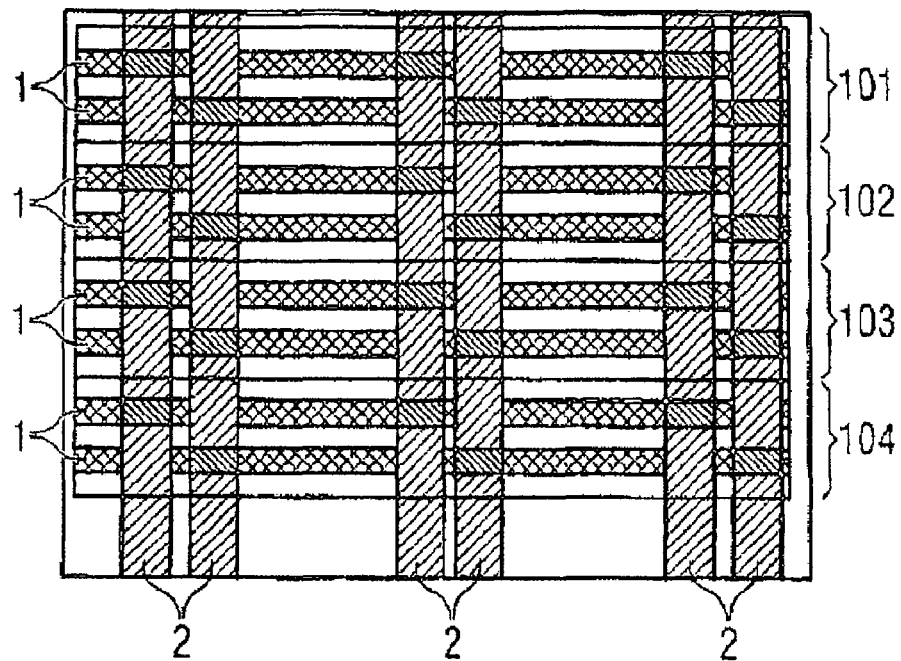
FIGS. 2A-B show a comparison of standard cell arrangements for ASICs and memory circuits.
Figure 2B:
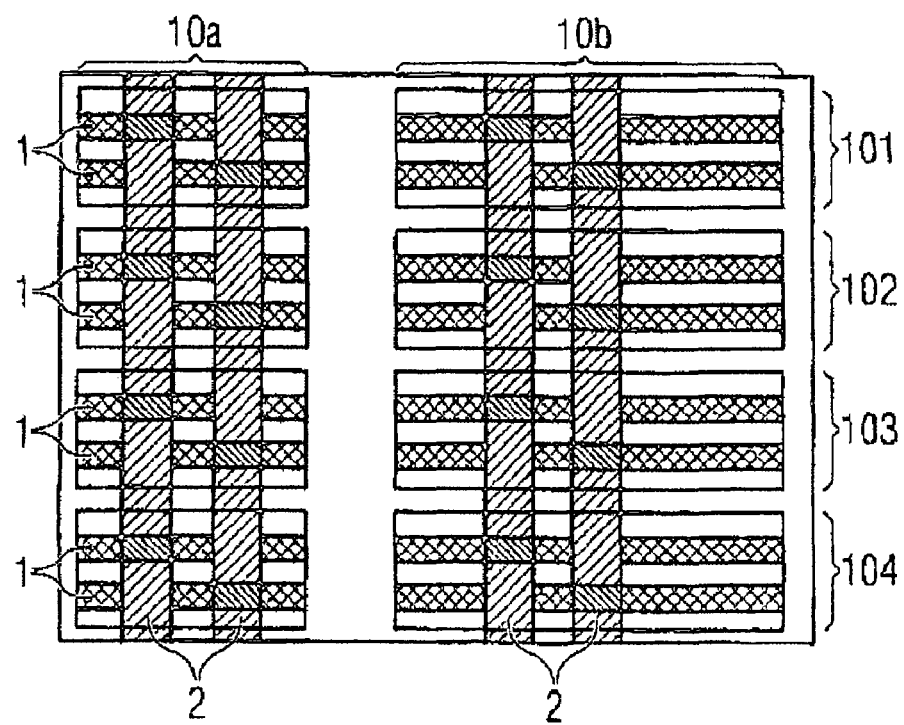

FIGS. 2A and 2B describe the differences between the standard cell arrangements for ASICs and for memory components.

FIG. 2A shows the arrangement for an ASIC, while FIG. 2B shows that for a memory component. In this case, one block of standard cell rows 101, 102, 103, 104 is in each case illustrated, in which voltage supply tracks 1 are used to supply voltage to the standard cells (not illustrated here) arranged in the standard cell rows 101, 102, 103, 104. In both cases, the metal tracks 2 are located on a different layer (at right angles to the plane of the drawing).

The arrangement for ASICs will be described first of all. In the case of ASICs, a plurality of equivalent metal layers are available for wiring.

In consequence, the standard cell groups 10 can generally be placed against one another without any separation. There is no need for vertical wiring channels.

Furthermore, when using an ASIC technology, the voltage supply to the standard cell rows 101, 102, 103, 104 can be reinforced at fixed intervals by means of metal tracks 2 on higher metal layers, which can be arranged like a network.

In the case of an ASIC technology, the standard cell rows 101, 102, 103, 104 are arranged in a row over the entire width of the block without any separation; the horizontal voltage supply tracks 1 are connected to vertically running metal tracks 2 at regular intervals, thus providing good control over the required width of the lines. Further supply lines can be added in higher metal layers, as required.

FIG. 2B shows an arrangement of the standard cell rows 101, 102, 103, 104 and a design for memory components. In the memory design, a group of standard cell rows 101, 102, 103, 104 (on the right in the figure) is separated by a vertical distance from another standard cell group with the standard cell rows 101a, 102a, 103a, 104a and is also interrupted horizontally by wiring channels: the vertical metal tracks 2, which are design-dependent only to a specific extent and are thus available at irregular intervals, are in each case connected at one point (or at more than one point) per standard cell row to the horizontal lines. Depending on the requirements and the availability of the vertical metal tracks 2, a first standard cell group 10a (on the left in FIG. 3A) is thus shorter than a second standard cell group 10b (in FIG. 3B). Further supply lines on higher metal layers are not available for the memory design.

FIG. 3 shows a program procedure for one embodiment of the method according to the invention. Individual method steps will then be explained in more detail in conjunction with FIGS. 4 and 5.

The method is based on a situation as illustrated in FIG. 4. In this case, the figure shows one standard cell row 101 with schematically illustrated standard cells 51, 52, 53, 54.

Problems can occur during the physical connection (routing) of the standard cell 51, 52, 53, 54 to metal tracks (not illustrated in FIG. 3), if the space between the standard cells 51, 52, 53, 54, is not sufficient. The router has to pass over longer distances, and this further reduces the space for connections. If the connections are laid too close together, this results in separation faults and possible short-circuits. It is also possible for some connections not to be routed at all (so-called "unconnects").

One embodiment of the method according to the invention ensures that the distance between standard cells 51, 52, 53, 54 is automatically such that the wiring can be produced well.

First of all, in a first method step 1001 (see FIG. 3), the distances between at least two standard cells 51, 52, 53, 54 are determined automatically. This is achieved by a means, which in this case, is part of a software package. For this purpose, for example, files can be evaluated which are used to store coordinates, grid widths or other parameters of the standard cells 51, 52, 53, 54.

Then, in the next method step 1002, a comparison is carried out to determine whether at least one distance $x_{act}$ between standard cells 51, 52, 53, 54 is less than a specific predetermined distance $x_{nom}$. This is done by a software comparison means.

In FIG. 4, the distance $x_{act}$ between two standard cells 52, 53 is less at one point than the predetermined value $x_{nom}$. This distance $x_{act}$ is too small for wiring. If all of the distances, $x_{act}$ are greater than $x_{nom}$, then it is possible to continue with the design (method step 1005).

If at least one distance $x_{act}$ is less than $x_{nom}$, the method according to an embodiment of the invention shifts the standard cells 51, 52, 53, 54 such that the minimum separation $x_{nom}$ is maintained, at least, at the end in each case.

For this purpose, the edge 50 of each standard cell 51, 52, 53, 54 in a virtual layout, is first of all enlarged by a modification means (third method step 1003).

This is described in FIGS. 5A and 5B. FIGS. 5A and 5B each show a single standard cell 5 with internal connections 6, 7 on different layers. The voltage supply tracks 1 are located transversely with respect to the essentially vertical extent of the standard cell 5. This standard cell 5 is part of a standard cell row 101, as is illustrated, for example, in FIG. 2A.

The standard cell 5 in FIG. 5A has an edge 50, which defines the space required in a standard cell 101 by means of the software that is used. In FIG. 5B, the edge 50' has been enlarged by computation means according to the invention, so that the virtual standard cell 50' requires more space. This standard cell 50' which has been modified in this way is not implemented in the layout but is broadened purely calculationally, that is to say, in a virtual layout of the standard cells. In the third method step 1003 (see FIG. 3), the broadened standard cells 50' (possibly together with standard cells which have not been broadened) are then placed in the virtual layout using the conventional placing routines.

An overlap can occur in this case between adjacent standard cells 51, 52, 53, 54. However, these can be overcome by means of the conventional placing routines by shifting the standard cells 51, 52, 53, 54 along the standard cell row 101, although this is only in the virtual layout.

In this case, the standard cells 5, 51, 52, 53, 54 do not all need to be virtually broadened. It is normally possible to deliberately only broaden individual standard cells 5, 51, 52, 53, 54.

In the fourth method step 1004 (see FIG. 3), the width of the standard cells 51, 52, 53, 54 is then reduced to the original width by a placing means in the virtual layout, so that the distances $x'_{act}$ in the virtual layout are now sufficiently large. This layout is now transferred to the real layout, so that this results in standard cells 51, 52, 53, 54 being placed with intervals which correspond at least to the distance $x_{nom}$.

The layout (the intrinsic nature, as well as the size in the x and y directions (bbox)) of a standard cell is described in a standardized file, the so-called LEF (library exchange format). All the cells from a standard cell library are written in this file.

Standard cells are designed using a specific grid, which is technology-dependent. This grid is likewise designed such that the router is provided with optimum routing conditions in the respective technology.

If it is now intended to enlarge the standard cells 5, 51, 52, 53, 54, then this can be done using the defined grid. Which cells are enlarged by what number of grid points can be defined using a simple list, with the respective cell names and a maximum permissible number of grids.

The bbox, that is to say the extent of the standard cell 5, 51, 52, 53, 54 in the x direction, is enlarged by an integer multiple of the grid in the LEF file for those standard cells 5, 51, 52, 53, 54 which are to be enlarged. Since, however, the real layout of the standard cell is not changed—and the changes in the width are made only on a temporary basis for an intermediate step (1003)—this results in virtual broadening in a virtual layout.

The original standard cells 5, 51, 52, 53, 54 are now interchanged with these broadened standard cells 5, 51, 52, 53, 54 in a virtually placed design. However, this means that overlaps can occur between the cells. In order to overcome these overlaps, an ECO (engineering change order) step is carried out, which slightly shifts the standard cells 5, 51, 52, 53, 54 in a standard cell row 101.

The enlarged standard cells are then once again replaced by the original cells. This results in a better and more uniform distribution of the standard cells 5, 51, 52, 53, 54 in the respective standard cell row 101, and thus increases the routing capability drastically in some circumstances.

The embodiment of the invention is not restricted to the preferred exemplary embodiments described above. In fact, a number of variants are feasible, which make use of the arrangement according to the invention and of the method according to the invention for fundamentally different types of embodiments, as well.

What is claimed is:

1. A method of producing a standard cell arrangement, the method comprising:
   automatically determining a distance between at least two standard cells in at least one standard cell row;
   automatically determining whether at least one of the determined distances is less than a predetermined minimum distance;
   if the distance is less than the minimum distance in at least one case, broadening the width of at least one standard cell in the standard cell row in a virtual layout of standard cells in a predetermined manner;
   automatically placing the at least one broadened standard cell in the virtual layout with other standard cells; and
   transferring the placing of the at least one broadened standard cell in the virtual layout to a real layout of the standard cells, wherein the standard cells are provided with the originally intended width again in order to create greater distances between the standard cells in the real layout.

2. The method according to claim 1, wherein the broadening of at least one standard cell in the virtual layout is carried out by an integer multiple of a predetermined grid width.

3. The method according to claim 2, further comprising fabricating a semiconductor device based upon the real layout.

4. The method according to claim 3, wherein the semiconductor device comprises a memory device.

5. The method according to claim 1, further comprising fabricating a semiconductor device based upon the real layout.

6. The method according to claim 5, wherein the semiconductor device comprises a memory device.

7. A method of producing a standard cell arrangement, the method comprising:
   in a first method step, automatically determining a distance between at least two standard cells in at least one standard cell row;
   in a second method step, automatically determining whether at least one of the determined distances is less than a predetermined minimum distance;
   in a third method step, if the distance is less than the minimum distance in at least one case, broadening the width of at least one standard cell in the standard cell row in a virtual layout of standard cells in a predetermined manner, and automatically placing the at least one broadened standard cell in the virtual layout with other standard cells; and
   in a fourth method step, transferring the placing of the broadened standard cells in the virtual layout to a real layout of the standard cells, wherein the standard cells are provided with the originally intended width again in order to create greater distances between the standard cells in the real layout;

wherein the first method step is performed before the second method step, the second method step is performed before the third method step, and the third method step is performed before the fourth method step.

8. The method according to claim 7, wherein the broadening of at least one standard cell in the virtual layout is carried out by an integer multiple of a predetermined grid width.

9. The method according to claim 8, further comprising fabricating a semiconductor device based upon the real layout.

10. The method according to claim 9, wherein the semiconductor device comprises a memory device.

11. The method according to claim 7, further comprising fabricating a semiconductor device based upon the real layout.

12. The method according to claim 11, wherein the semiconductor device comprises a memory device.

13. An apparatus for producing a standard cell arrangement, the apparatus comprising:

means for automatically determining the distance between at least two standard cells;

comparison means for automatically determining whether at least one of the distances is less than a predetermined minimum distance;

modification means for broadening the width of at least one standard cell in a standard cell row in a virtual layout of standard cells in a predetermined manner if the distance is less than the minimum distance, wherein the at least one broadened standard cell is automatically placed in the virtual layout with other standard cells; and placing means for placing the broadened standard cells and/or the non-broadened standard cells in the virtual layout into a real layout of the standard cells, wherein the standard cells are provided with the originally intended width again in order to create greater distances between the standard cells in the real layout.

14. The apparatus according to claim 13, wherein the broadening of at least one standard cell in the virtual layout is carried out by an integer multiple of a predetermined grid width.

* * * * *